United States Patent
Kitaoka et al.

(10) Patent No.: US 7,255,742 B2
(45) Date of Patent: Aug. 14, 2007

(54) METHOD OF MANUFACTURING GROUP III NITRIDE CRYSTALS, METHOD OF MANUFACTURING SEMICONDUCTOR SUBSTRATE, GROUP III NITRIDE CRYSTALS, SEMICONDUCTOR SUBSTRATE, AND ELECTRONIC DEVICE

(75) Inventors: Yasuo Kitaoka, Ibaraki (JP); Hisashi Minemoto, Hirakata (JP); Isao Kidoguchi, Kawanishi (JP); Takatomo Sasaki, Suita (JP); Yusuke Mori, 8-16-9, Kisaichi, Katano-shi, Osaka (JP) 576-0033; Fumio Kawamura, Minoh (JP)

(73) Assignees: Matsushita Electric Industrial Co., Ltd., Osaka (JP); Yusuke Mori, Osaka (JP)

( * ) Notice: Subject to any disclaimer, the term of this patent is extended or adjusted under 35 U.S.C. 154(b) by 346 days.

(21) Appl. No.: 10/884,252

(22) Filed: Jul. 2, 2004

(65) Prior Publication Data
US 2005/0011432 A1    Jan. 20, 2005

(30) Foreign Application Priority Data
Jul. 2, 2003    (JP)    ............... 2003-190554

(51) Int. Cl.
*C30B 29/38*    (2006.01)
(52) U.S. Cl. ............... 117/81; 117/82; 117/83; 117/95; 117/96; 117/956
(58) Field of Classification Search ............ 117/81, 117/82, 83, 95, 96, 956
See application file for complete search history.

(56) References Cited

U.S. PATENT DOCUMENTS 5,868,837 A    2/1999    DiSalvo et al.

(Continued)

FOREIGN PATENT DOCUMENTS

JP    11-145516    5/1999

(Continued)

OTHER PUBLICATIONS

Kawamura et al., "Growth of a Large GaN single Crystal Using the Liquid Phase Epitaxy (LPE) Technique" Japanese Journal of Applied Physics vol. 42 (2003) pp. L4-L6.

(Continued)

*Primary Examiner*—Robert Kunemund
(74) *Attorney, Agent, or Firm*—Hamre, Schumann, Mueller & Larson, P.C.

(57) ABSTRACT

The present invention provides a method of manufacturing Group III nitride crystals that are of high quality, are manufactured efficiently, and are useful and usable as a substrate for semiconductor manufacturing processes. A semiconductor layer that is made of a semiconductor and includes crystal-nucleus generation regions at its surface is formed. The semiconductor is expressed by a composition formula of $Al_uGa_vIn_{1-u-v}N$ (where $0 \leq u \leq 1$, $0 \leq v \leq 1$, and $u+v \leq 1$). Group III nitride crystals then are grown on the semiconductor layer by bringing the crystal-nucleus generation regions of the semiconductor layer into contact with a melt in an atmosphere including nitrogen. The melt contains nitrogen, at least one Group III element selected from the group consisting of gallium, aluminum, and indium, and at least one of alkali metal and alkaline-earth metal.

26 Claims, 8 Drawing Sheets

U.S. PATENT DOCUMENTS

| | | |
|---|---|---|
| 6,121,121 A | 9/2000 | Koide |
| 6,252,255 B1 | 6/2001 | Ueta et al. |
| 6,270,569 B1 | 8/2001 | Shibata et al. |
| 6,447,604 B1 | 9/2002 | Flynn et al. |
| 6,503,610 B2 | 1/2003 | Hiramatsu et al. |
| 6,592,663 B1 | 7/2003 | Sarayama et al. |
| 6,614,059 B1 | 9/2003 | Tsujimura et al. |
| 6,667,252 B2 | 12/2003 | Miyajima et al. |
| 2003/0042496 A1 | 3/2003 | Sasaoka |
| 2004/0124434 A1 | 7/2004 | D'Evelyn et al. |
| 2004/0144300 A1* | 7/2004 | Kitaoka et al. ............... 117/2 |
| 2004/0147096 A1* | 7/2004 | Kitaoka et al. ............. 438/483 |
| 2004/0183090 A1 | 9/2004 | Kitaoka et al. |
| 2004/0262630 A1* | 12/2004 | Kitaoka et al. ............. 257/189 |
| 2005/0011432 A1 | 1/2005 | Kitaoka et al. |
| 2005/0082564 A1 | 4/2005 | Kitaoka et al. |

FOREIGN PATENT DOCUMENTS

| | | |
|---|---|---|
| JP | 2000-357663 | 12/2000 |
| JP | 2002-293696 | 10/2002 |
| JP | 3409576 | 3/2003 |
| WO | 2004/013385 | 2/2004 |

OTHER PUBLICATIONS

Kozawa, et al., "Raman scattering from LO phonon-plasmon coupled modes in gallium nitride", Journal of Applied Physcis, Jan. 15, 1994, 74(2), 1098-1101—Abstract Only.

M. Morishita, et al. "The growth mechanism of GaN singles crystals in Na flux system", Journal of the Japanese association for crystal growth, vol. 30, No. 3 (2003), 801aA7.

M. Morishita, et al., "Growth of transparent GaN single crystals using LPE technique in Na flux system", The Japan Society of Applied Physics and Related Societies, Extended Abstracts (The 51st Spring Meeting, 2004), 29 p-YK-6.

* cited by examiner

METHOD OF MANUFACTURING GROUP III NITRIDE CRYSTALS, METHOD OF MANUFACTURING SEMICONDUCTOR SUBSTRATE, GROUP III NITRIDE CRYSTALS, SEMICONDUCTOR SUBSTRATE, AND ELECTRONIC DEVICE

BACKGROUND OF THE INVENTION

1. Field of the Invention

The present invention relates generally to a method of manufacturing Group III nitride crystals, a method of manufacturing a semiconductor substrate, Group III nitride crystals, a semiconductor substrate, and an electronic device.

2. Related Background Art

A Group III nitride compound semiconductor such as, for instance, gallium nitride (GaN) (hereinafter also referred to as a "Group III nitride semiconductor" or a "GaN-based semiconductor") has been gaining attention as a material for semiconductor devices that emit green, blue or ultraviolet light. A laser diode (LD) that emits blue light is used for high-density optical disk devices or displays while a light emitting diode (LED) that emits blue light is used for displays, lighting, etc. It is expected to use an ultraviolet LD in the field of, for instance, biotechnology and an ultraviolet LED as, for example, an ultraviolet source for a fluorescent lamp.

Substrates of a Group III nitride semiconductor (for example, GaN) that are used for LDs or LEDs usually are formed by heteroepitaxially growing Group III nitride crystals on a sapphire substrate using vapor phase epitaxy. Generally, crystals obtained by this method have a dislocation density of $10^8$ cm$^{-2}$ to $10^9$ cm$^{-2}$ and thus reducing the dislocation density has been an important issue for this method. In order to resolve this issue, how to reduce the dislocation density has been considered, and, for example, an epitaxial lateral overgrowth (ELOG) method has been developed (see, for instance, JP11(1999)-145516A). With this method, the dislocation density can be reduced to about $10^5$ cm$^{-2}$ to $10^6$ cm$^{-2}$, but the manufacturing process is complicated.

On the other hand, besides the vapor phase epitaxy, a method of growing crystals from a liquid phase also has been studied. However, since the equilibrium vapor pressure of nitrogen is at least 10000 atm (10000×1.013×10$^5$ Pa) at the melting point of Group III nitride single crystals such as GaN, conventionally it has been understood that conditions including 8000 atm (8000×1.013×10$^5$ Pa) and 1200° C. are required for growing GaN from a liquid phase. In this connection, recently, it was disclosed that the use of a Na flux allowed GaN to be synthesized at a relatively low temperature and pressure, specifically, 750° C. and 50 atm (50×1.013×10$^5$ Pa) (see, for instance, U.S. Pat. No. 5,868, 837).

Recently, single crystals whose maximum crystal size is about 1.2 mm are obtained by a method in which a mixture of Ga and Na is melted in a nitrogen gas atmosphere containing ammonia at 800° C. and 50 atm (50×1.013×10$^5$ Pa), and then crystals are grown for 96 hours using the melt (see, for instance, JP2002-293696A).

Furthermore, another method also has been reported in which a GaN crystal layer is formed on a sapphire substrate by a metalorganic chemical vapor deposition (MOCVD) method and then single crystals are grown by a liquid phase epitaxy (LPE) method (Jpn. J. Appl. Phys., Vol. 42, (2003) pp4-6).

However, the quality of the Group III nitride crystals obtained using the conventional techniques may not be sufficient. Hence, there are demands for a technique of manufacturing crystals of higher quality.

SUMMARY OF THE INVENTION

With the above in mind, the present invention is intended to provide a method of manufacturing Group III nitride crystals that can be used as a substrate for semiconductor manufacturing processes and can grow steadily in a flux.

In order to achieve the object mentioned above, the method of manufacturing Group III nitride crystals according to the present invention includes the following processes (i) and (ii):

(i) forming a semiconductor layer that includes crystal-nucleus generation regions at its surface and being made of a semiconductor that is expressed by a composition formula of $Al_uGa_vIn_{1-u-v}N$ (where $0 \leq u \leq 1$, $0 \leq v \leq 1$, and $u+v \leq 1$); and (ii) growing Group III nitride crystals on the semiconductor layer by bringing the crystal-nucleus generation regions of the semiconductor layer into contact with a melt in an atmosphere including nitrogen, with the melt containing nitrogen, at least one Group III element selected from the group consisting of gallium, aluminum, and indium, and at least one of alkali metal and alkaline-earth metal.

The present inventors made a series of studies about the growth of Group III nitride crystals in a flux. In the course of the studies, it was found that the manner of crystal growth varied depending on the type of seed layer to be used for growing Group III nitride crystals. The present inventors made further studies about the relationship between the growth of Group III nitride crystals and the seed layer. As a result, the present inventors found that the growth of Group III nitride crystals depended considerably on the state of the surface of the seed layer, and it was necessary to control the state of the surface of the seed layer in order to grow crystals steadily in a flux. As in the manufacturing method of the present invention, the use of a semiconductor layer (a seed layer) including crystal-nucleus generation regions at its surface facilitates steady growth of Group III nitride crystals since the growth of crystal nuclei is promoted in the crystal-nucleus generation regions. According to the manufacturing method of the present invention, since crystal nuclei are generated selectively in the crystal-nucleus generation regions, the quality of the Group III nitride crystals can be improved further.

DETAILED DESCRIPTION OF THE INVENTION

Figure 1A:
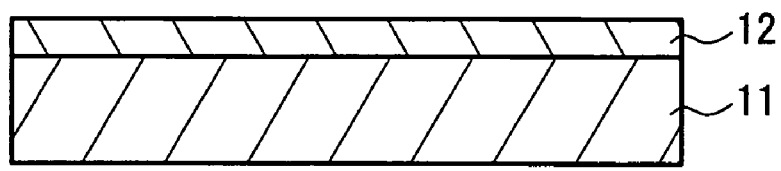
FIGS. 1A to 1C are cross-sectional views showing processes of an example of the manufacturing method according to the present invention.
Figure 1B:
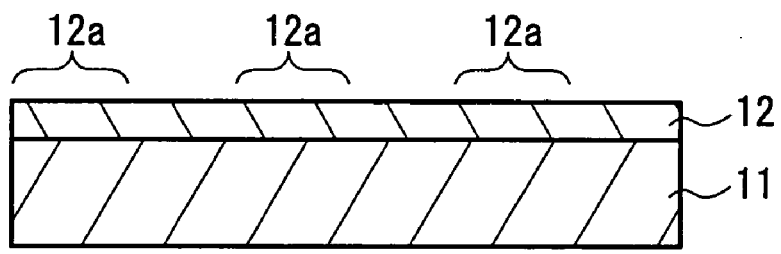

Hereafter, the present invention is described in detail.

In the manufacturing method of the present invention, the method of forming the semiconductor layer including the crystal-nucleus generation regions is not particularly limited. As described below, the method can be, for instance, one in which the semiconductor layer including the crystal-nucleus generation regions is formed by exposing the surface of a preformed semiconductor layer to the air or processing the surface, or one in which the semiconductor layer is formed, with the twist angle and the carrier concentration being controlled as described above. The crystal-nucleus generation regions may be formed at the surface of the semiconductor layer over the entire surface or only in some parts thereof. The crystal-nucleus generation regions can be measured by, for instance, the twist angle, the carrier concentration, or the cross-sectional shapes of the crystal-nucleus generation regions formed by exposing the surface of a preformed semiconductor layer to the air, processing or etching the surface.

In the manufacturing method of the present invention, the twist angle of the crystal-nucleus generation regions is, for example, 680 seconds or smaller, and preferably 412 seconds.

The twist angle denotes the half-value width of a rocking curve of X-ray diffraction ((10-10) diffraction). For example, the half-value width of a rocking curve of X-ray diffraction can be determined from the full width at half maximum (FWHM) whose center is the peak of X-rays diffracted by the semiconductor layer when the semiconductor layer is irradiated with X-rays emitted from an X-ray source. The X-ray source is not particularly limited but can be a CuK alpha-ray source for example.

In the manufacturing method of the present invention, examples of the method of controlling the twist angle of the crystal-nucleus generation regions of the semiconductor layer include controlling conditions such as the growth rate, growth temperature, or thickness of a semiconductor layer to be grown. For instance, a sample in which twist angles are small can be produced under the condition such as a semiconductor layer is grown to become thick under the slow growth rate in optimal growth temperature. With such a method, samples in which twist angles are different from each other can be produced.

In the manufacturing method of the present invention, the carrier concentration of the crystal-nucleus generation regions is, for instance, $1 \times 10^{17}$ cm$^{-3}$ or lower, preferably $5 \times 10^{16}$ cm$^{-3}$, and more preferably $1 \times 10^{16}$ cm$^{-3}$. The carrier concentration can be determined by, for instance, Hall measurement or CV (Capacitance-Voltage) measurement. In this connection, it is conceivable that the carriers are generated as a result of the introduction, into crystals, of oxygen, Si, or the like that originates from members of the furnace used for crystal growth.

In the manufacturing method of the present invention, the method of controlling the carrier concentration of the crystal-nucleus generation regions of the semiconductor layer may be, for instance, a method in which a raw material gas having a particularly high purity is used in forming the semiconductor layer through the vapor phase epitaxy that is carried out by the HVPE method or MOCVD method, a method using a quartz reaction tube that has been used up satisfactorily, or a method in which a quartz reaction tube of a HVPE apparatus or a MOCVD apparatus is coated with, for example, BN, AlN, or SiC. Among them, particularly the method including coating the quartz reaction tube is preferable. When the quartz reaction tube is coated, for instance, the amount of Si or oxygen to be taken into the semiconductor layer from the surface of the reaction apparatus can be reduced further. This considerably facilitates the control of carrier concentration. In the above, "the method using a quartz reaction tube that has been used up satisfactorily" denotes a method in which using a quartz reaction tube and other members of the furnace, dummy crystals are grown several times to several tens of times to reduce the concentration of the carriers contained in the quartz reaction tube and other members, and then intended crystal growth is carried out.

In the manufacturing method of the present invention, it is preferable that the process (i) includes: (i-1) forming an undercoating layer made of a semiconductor that is expressed by a composition formula of $Al_sGa_tIn_{1-s-t}N$ (where $0 \leq s \leq 1$, $0 \leq t \leq 1$, and $s+t \leq 1$); (i-2) exposing the surface of the undercoating layer to the air; and (i-3) forming the semiconductor layer on the undercoating layer by growing a semiconductor that is expressed by a composition formula of $Al_uGa_vIn_{1-u-v}N$ (where $0 \leq u \leq 1$, $0 \leq v \leq 1$, and $u+v \leq 1$). In this case, the crystal-nucleus generation regions include at least one of pits and hillocks.

In the manufacturing method of the present invention, the process (i) may include: (i-a) forming a semiconductor layer made of a semiconductor that is expressed by a composition formula of $Al_uGa_vIn_{1-u-v}N$ (where $0 \leq u \leq 1$, $0 \leq v \leq 1$, and $u+v \leq 1$); and (i-b) processing the surface of the semiconductor layer.

In the manufacturing method of the present invention, the process (i-b) may include a process of roughening the surface of the semiconductor layer by etching. Examples of the etching method include dry etching and wet etching.

In the manufacturing method of the present invention, the process (i-b) may include a process of machining the surface of the semiconductor layer. In this case, in the process (i-a), the semiconductor layer may be formed so as to have a (0001) plane as its surface, and in the process (i-b), the surface of the semiconductor layer may be ground to be a plane that is inclined with respect to the (0001) plane.

In the manufacturing method of the present invention, the Group III element may be gallium, and the Group III nitride crystals may be gallium nitride.

In the manufacturing method of the present invention, the atmosphere may be a pressurized atmosphere.

In the manufacturing method of the present invention, it is preferable that the semiconductor layer is formed on a substrate. The substrate is not particularly limited but may be, for instance, a GaAs substrate whose surface is a (111)

plane, a Si substrate whose surface is a (111) plane, a sapphire substrate whose surface is a (0001) plane, or a SiC substrate whose surface is a (0001) plane. Among them, the sapphire substrate and the SiC substrate are preferable.

An electronic device of the present invention includes a semiconductor device formed on a substrate, wherein the substrate is Group III nitride crystals manufactured by the manufacturing method of the present invention.

In the electronic device, the semiconductor device may be a laser diode, a light emitting diode, or a field effect transistor.

The electronic device may be a high frequency device or a high power device.

Hereinafter, the present invention is described using examples with suitable reference to the drawings but is not limited by the following embodiments. In the following embodiments, the semiconductor layer is formed on a substrate, but the present invention is not limited thereto.

Embodiment 1

In this method, first, a semiconductor layer 12 is formed on a substrate 11 as shown in FIG. 1A (process (i)). The semiconductor layer 12 is formed of a semiconductor that is expressed by a composition formula of $Al_uGa_vIn_{1-u-v}N$ (where $0 \leq u \leq 1$, $0 \leq v \leq 1$, and $u+v \leq 1$). The semiconductor layer 12 has crystal-nucleus generation regions 12a at its surface. The semiconductor layer 12 is a seed layer to serve as seed crystals and is formed of, for example, GaN or $Al_uGa_{1-u}N$ (where $0 \leq u \leq 1$). The method for forming the semiconductor layer 12 is described later. The substrate 11 can be, for instance, a sapphire substrate, a GaAs substrate, a Si substrate, or a SiC substrate, specifically, for example, a GaAs substrate whose surface is a (111) plane, a Si substrate whose surface is a (111) plane, a sapphire substrate whose surface is a (0001) plane, or a SiC substrate whose surface is a (0001) plane. Another semiconductor layer may be included between the substrate 11 and the semiconductor layer 12. Furthermore, the crystal-nucleus generation regions 12a may be formed over the entire surface of the semiconductor layer 12.

Figure 1C:
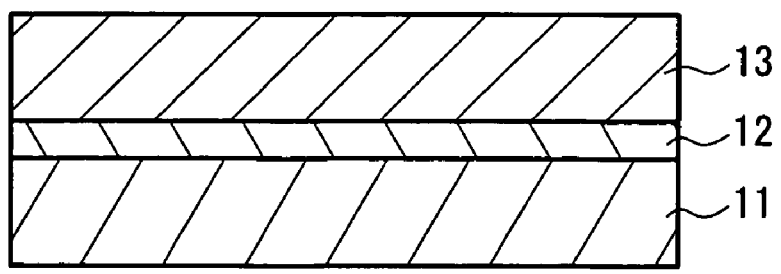

Next, Group III nitride crystals are grown on the semiconductor layer 12 by bringing the surface (one including the crystal-nucleus generation regions 12a) of the semiconductor layer 12 into contact with a melt in an atmosphere (preferably a pressurized atmosphere of 100 atm ($100 \times 1.013 \times 10^5$ Pa) or lower) including nitrogen (process (ii)). The melt contains: at least one Group III element selected from the group consisting of gallium, aluminum, and indium; at least one of alkali metal and alkaline-earth metal; and nitrogen. As shown in FIG. 1C, Group III nitride crystals 13 are grown on the semiconductor layer 12 through the process (ii). In the method of the present invention, the crystal-nucleus generation regions 12a where crystal nuclei tend to be generated have been formed at the surface of the semiconductor layer 12 that serves as a seed layer. Accordingly, crystal nuclei are generated in the crystal-nucleus generation regions 12a in the process (ii). This facilitates the growth of Group III nitride crystals.

It is preferable that the melt contains one of alkali metal and alkaline-earth metal or both of them. Examples of the alkali metal include sodium, lithium, potassium, rubidium, and cesium. They may be used individually, or two or more of them may be used together. Examples of the alkaline-earth metal include Ca, Mg, Sr, Ba, and Be. They may be used individually, or two or more of them may be used together. Furthermore, a mixture of alkali metal and alkaline-earth metal may be used. In this case, a mixture of sodium and calcium is preferable. The atmosphere including nitrogen can be, for instance, a nitrogen gas atmosphere or a nitrogen gas atmosphere including ammonia.

The melt can be prepared by, for instance, placing materials such as a Group III nitride element and the like in a crucible and then heating them. After being prepared, the melt is brought into a supersaturation state and thereby semiconductor crystals grow. The melting of the materials and the crystal growth are carried out, for instance, at a temperature of about 700° C. to 1100° C. and a pressure of around 1 atm ($1 \times 1.013 \times 10^5$ Pa) to 100 atm ($100 \times 1.013 \times 10^5$ Pa). This method makes it possible to obtain Group III nitride crystals that are expressed by a composition formula of $Al_xGa_yIn_{1-x-y}N$ (where $0 \leq x \leq 1$, $0 \leq y \leq 1$, and $x+y \leq 1$), for instance, GaN crystals or crystals that are expressed by a composition formula of $Al_xGa_{1-x}N$ (where $0 \leq x \leq 1$).

The process (i) is described below using examples.

In a first example, first, an undercoating layer is formed on a substrate (process (i-1)). The undercoating layer is made of a semiconductor that is expressed by a composition formula of $Al_sGa_tIn_{1-s-t}N$ (where $0 \leq s \leq 1$, $0 \leq t \leq 1$, and $s+t \leq 1$). The undercoating layer can be formed by, for instance, the MOCVD method, the MBE method, or the HVPE method.

Subsequently, the surface of the undercoating layer is exposed to the air (process (i-2)). This can be carried out by, for instance, taking out the substrate with the undercoating layer formed thereon from a film-formation apparatus.

Next, a semiconductor that is expressed by a composition formula of $Al_uGa_vIn_{1-u-v}N$ (where $0 \leq u \leq 1$, $0 \leq v \leq 1$, and $u+v \leq 1$) is grown on the undercoating layer to form a semiconductor layer (process (i-3)). In this process, pits and hillocks are formed at the surface of the semiconductor layer that is formed on the undercoating layer exposed to the air. The pits and hillocks may be crystal-nucleus generation regions.

In a second example, first, a semiconductor layer is formed on a substrate (process (i-a)). The semiconductor layer is made of a semiconductor that is expressed by a composition formula of $Al_uGa_vIn_{1-u-v}N$ (where $0 \leq u \leq 1$, $0 \leq v \leq 1$, and $u+v \leq 1$). This semiconductor layer can be formed by, for instance, the MOCVD method, the MBE method, or the HVPE method.

Subsequently, the surface of the semiconductor layer is processed and thereby crystal-nucleus generation regions are formed at the surface (process (i-b)). This process allows the surface of the semiconductor layer to be roughened and the surface thus roughened serves as the crystal-nucleus generation regions. Such a rough surface facilitates the generation of crystal nuclei. Examples of the processing method include dry etching, wet etching, and machining.

The dry etching can be carried out by, for instance, a method in which the surface of the semiconductor layer is treated with $CF_4$ gas at 80 W for 30 minutes. The wet etching can be carried out using, for instance, a KOH aqueous solution or a phosphoric acid aqueous solution.

When machining is to be carried out, grooves may be formed at the surface of the semiconductor layer by, for instance, scribing or dicing. The semiconductor layer may be formed so as to have a surface that is a (0001) plane in the process (i-a) and then the surface of the semiconductor layer may be ground to be a plane that is inclined with respect to the (0001) plane in the process (i-b). The formation of a plane other than the (0001) plane as the surface of the semiconductor layer facilitates the generation of crystal nuclei. Furthermore, it also is possible to make impurities adhere to the surface of the semiconductor layer and to allow portions of the surface to which the impurities have adhered, to serve as crystal-nucleus generation regions.

The crystal-nucleus generation regions can be formed in various shapes such as, for example, a stripe shape, a dot shape, or a mesh shape. The crystal-nucleus generation regions may be formed in a shape that is suitable for a device in which the Group III nitride crystals are to be used. For example, when the Group III nitride crystals are used for a semiconductor laser, the stripe shape or the like is preferable.

When a semiconductor device is to be manufactured using Group III nitride crystals produced by the method of the present invention, the semiconductor device is formed on the Group III nitride crystals subsequent to the process (ii). Thus an electronic device can be manufactured. The semiconductor device can be, for instance, a laser diode, a light emitting diode, or a field effect transistor. The electronic device may be a high frequency device or a high power device.

Embodiment 2

In Embodiment 2, the description is directed to an example of producing a field effect transistor. First, a GaN semiconductor layer and an AlGaN semiconductor layer are formed by the MOCVD method on insulative GaN crystals formed by the LPE method. Subsequently, a source electrode, a gate electrode, and a drain electrode are formed on the AlGaN semiconductor layer. The GaN crystals formed by the LPE method are characterized in having an excellent insulation property due to fewer dislocations and defectives caused therein. The control of gate voltage makes it possible to control the concentration of two-dimensional electron gas that is generated between the GaN semiconductor layer and the AlGaN semiconductor layer, and thereby a high-speed transistor can be obtained.

Embodiment 3

In Embodiment 3, the description is directed to an example of producing a semiconductor laser. An n-type GaN layer is formed on GaN crystals formed by the LPE method, an active layer made of an InGaN layer is formed thereon, and a p-type GaN layer is formed further thereon. Electrodes then are formed on the n-type GaN layer and the p-type GaN layer, respectively. Thus, a light emitting device can be obtained.

Embodiment 4

Figure 8:
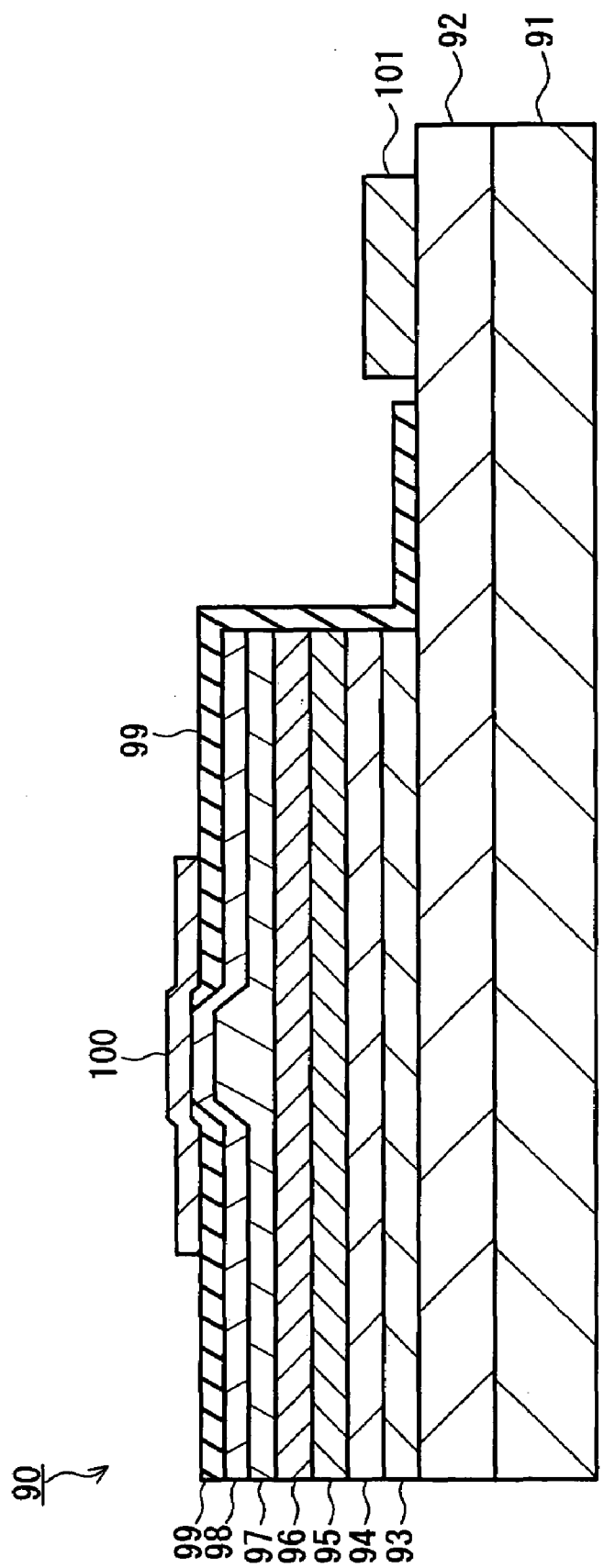
FIG. 8 is a schematic cross-sectional view showing an example of the semiconductor device according to the present invention.

This embodiment is an example of producing a semiconductor laser using a semiconductor substrate of the present invention. FIG. 8 shows a cross-sectional view of the configuration of the semiconductor laser. This semiconductor laser can be produced as follows, for example.

First, a contact layer 92 of n-type GaN doped with Si to have a carrier concentration of $5 \times 10^{18}$ cm$^{-3}$ or lower is formed on a substrate 91 made of GaN crystals that are obtained according to the above-mentioned embodiments. In GaN-based crystals (crystals containing Ga and N), when Si is added thereto as an impurity, holes present in Ga increase in number. Since the holes present in Ga diffuse easily, they have harmful effects in terms of, for example, lifetime when a device is formed thereon. Hence, the doping amount may be controlled so that the contact layer has a carrier concentration of $3 \times 10^{18}$ cm$^{-3}$ or lower.

Next, a cladding layer 93 of n-type $Al_{0.07}Ga_{0.93}N$ and a light guiding layer 94 of n-type GaN are formed sequentially on the contact layer 92. Subsequently, a multiple quantum well (MQW) composed of a well layer (with a thickness of about 3 nm) made of $Ga_{0.8}In_{0.2}N$ and a barrier layer (with a thickness of about 6 nm) made of GaN is formed as an active layer 95. Thereafter, a light guiding layer 96 of p-type GaN, a cladding layer 97 of p-type $Al_{0.07}Ga_{0.93}N$, and a contact layer 98 of p-type GaN are formed sequentially on the active layer 95. These layers can be formed by well-known methods. The semiconductor laser 90 is of a double-hetero junction type. The energy gap of the well layer containing indium in the MQW active layer is smaller than those of the n-type and p-type cladding layers containing aluminum. On the other hand, the highest optical refractive index is obtained in the well layer of the active layer 95, while the light guiding layers and the cladding layers have optical refractive indices that decrease in this order.

An insulating film 99 forming a current injection region having a width of about 2 μm is formed on the contact layer 98. A ridge part to serve as a current constriction part is formed in the upper portion of the p-type cladding layer 97 and the p-type contact layer 98.

A p-side electrode 100 that is in ohmic contact with the contact layer 98 is formed on the upper side of the p-type contact layer 98. An n-side electrode 101 that is in ohmic contact with the contact layer 92 is formed on the n-type contact layer 92.

The semiconductor laser produced by the above-mentioned method was subjected to a device evaluation. When a predetermined forward voltage was applied between the p-side electrode and the n-side electrode of the semiconductor laser obtained in the above, positive holes and electrons were injected into the MQW active layer from the p-side electrode and the n-side electrode, respectively. The positive holes and electrons thus injected were recombined with each other in the MQW active layer to produce optical gain, and thereby the semiconductor laser generated oscillation with an emission wavelength of 404 nm.

In the present embodiment, the description was made with respect to the GaN single crystal substrate. It, however, is preferable that a substrate to be provided has a low absorptance at a wavelength that is used in an optical device to be produced on the substrate. Accordingly, it is preferable that a substrate for a semiconductor laser or a light emitting diode that emits light in the ultraviolet region is formed of $Al_xGa_{1-x}N$ (where $0 \leq x \leq 1$) single crystals that contain a large amount of Al and have low absorptivity with respect to light with short wavelengths. According to the present invention, such Group III nitride semiconductor single crystals can be formed even when part of Ga is substituted by another Group III element.

Embodiment 5

Figure 9:
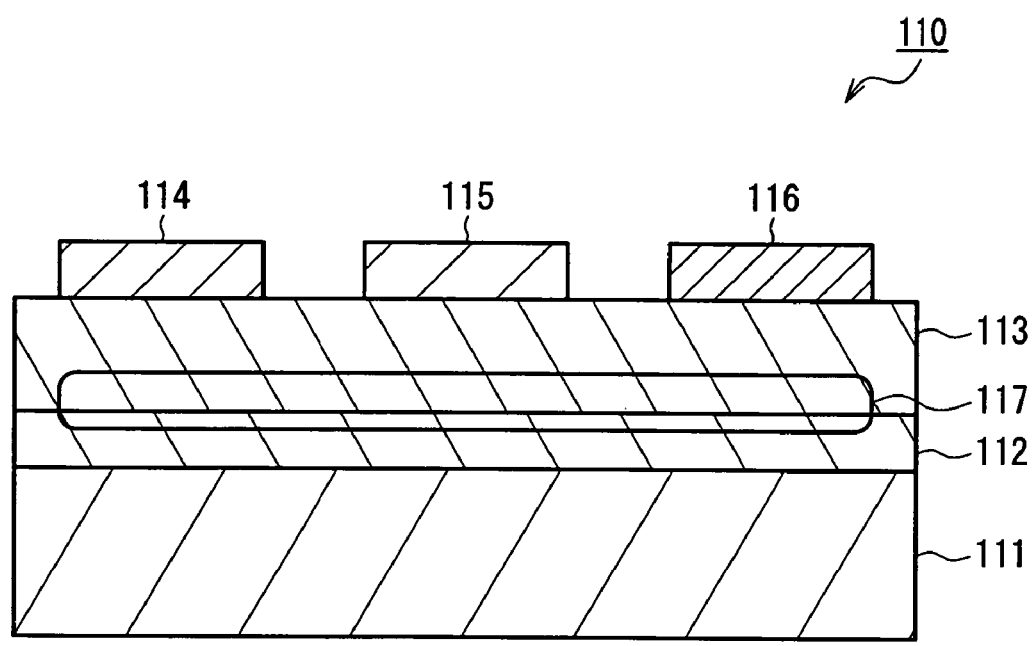
FIG. 9 is a schematic cross-sectional view showing another example of the semiconductor device according to the present invention.

An example of producing a field effect transistor (FET) using a semiconductor substrate of the present invention is described now. The configuration of the FET 110 is shown schematically in FIG. 9. An undoped GaN substrate 111 is used as a substrate. The GaN substrate 111 can be obtained through the liquid phase epitaxy using a flux. The GaN substrate 111 obtained through the liquid phase epitaxy has an electrical resistance of, for instance, at least $10^{10}$ Ω and therefore has characteristics similar to those of an insulator. A GaN layer 112 and a AlGaN layer 113 are formed sequentially on the GaN substrate 111 by the MOCVD method. Furthermore, a source electrode 114, a Schottky gate electrode 115, and a drain electrode 116 are formed on the AlGaN layer 113. Voltage is applied to the Schottky gate electrode 115 to control the concentration of two-dimensional electron gas 117 that is generated at the interface between the GaN layer 112 and the AlGaN layer 113. Thus the operation as a transistor is carried out.

The GaN substrate formed by the method of the present invention has fewer defects and a low dislocation density. Hence, it is possible to obtain a FET that has a high insulation ability, allows the leakage current that is caused during its operation to be reduced, and has an excellent high frequency property.

The present invention is described further in detail using the following examples. In the following examples, the description is directed to the production of GaN crystals. However, Group III nitride crystals that are expressed by a composition formula of $Al_xGa_yIn_{1-x-y}N$ (where $0 \leq x \leq 1$, $0 \leq y \leq 1$, and $x+y \leq 1$) such as, for instance, $Al_xGa_{1-x}N$ and AlN also can be formed by the same method.

Example 1

Example 1 is an example in which Group III nitride crystals are produced by the method described as the second example of Embodiment 1.

The configuration of the Group III nitride crystals formed in this example is shown in FIGS. 2A to 2D. As shown in FIGS. 2A to 2D, a semiconductor layer 22 containing GaN and an LPE-GaN layer 23 are formed sequentially on a sapphire substrate 21 made of sapphire (crystalline $Al_2O_3$). The semiconductor layer 22 is formed of Group III nitride that satisfies a composition formula of $Al_uGa_vIn_{1-u-v}N$ (where $0 \leq u \leq 1$, $0 \leq v \leq 1$, and $u+v \leq 1$). The present example is characterized in that crystal-nucleus generation regions 22a are formed at the surface of the semiconductor layer 22.

Figure 2A:
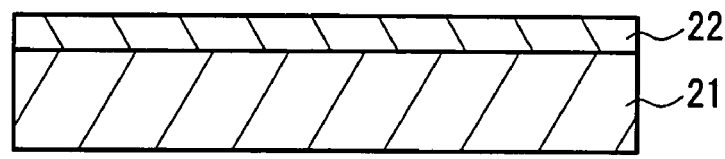
FIGS. 2A to 2D are cross-sectional views showing processes of another example of the manufacturing method according to the present invention.

The method of manufacturing Group III nitride crystals used in this example is described with reference to FIGS. 2A to 2D. First, as shown in FIG. 2A, the semiconductor layer 22 containing GaN was formed on the sapphire substrate 21. Specifically, the sapphire substrate 21 was heated to have a temperature of about 1020° C. to 1100° C. and then trimethylgallium (TMG) and $NH_3$ were supplied onto the substrate 21. Thus the semiconductor layer 22 was formed.

Figure 2B:
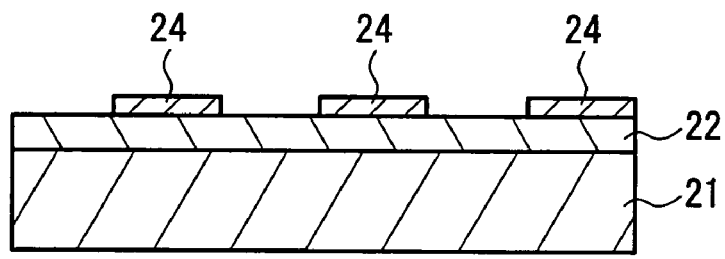

Next, as shown in FIG. 2B, a stripe-like resist pattern 24 was formed on the surface of the semiconductor layer 22 by photolithography.

Figure 2C:
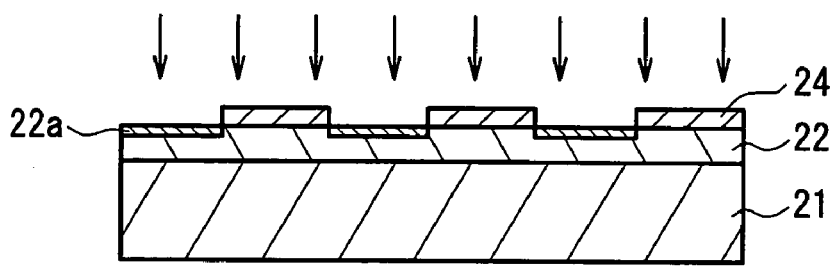
Figure 2D:
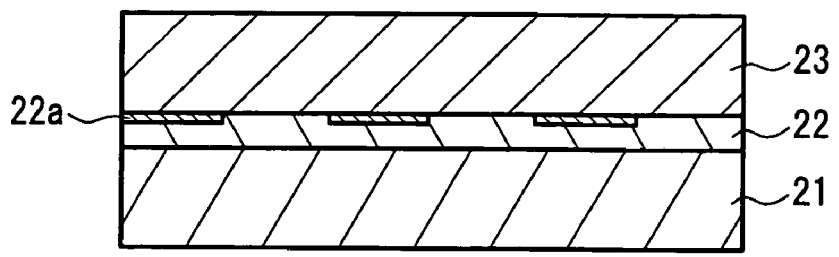

Subsequently, as shown in FIG. 2C, the surface of the semiconductor layer 22 was treated by dry etching using $CF_4$ gas. Thus, crystal-nucleus generation regions 22a were formed in portions of the surface of the semiconductor layer 22 where the resist pattern 24 had not been formed. The dry etching was carried out at 80 W for 30 minutes using a parallel-plate reactive dry etching (RIE) unit. As the result of the dry etching, a number of pits were formed at the surface of the semiconductor layer 22 and these pits served as crystal-nucleus generation regions. The shape of the crystal-nucleus generation regions is not limited to the stripe shape but dot-like crystal-nucleus generation regions may be formed according to the intended use of the Group III nitride crystals. Furthermore, the crystal-nucleus generation regions may be formed over the entire surface of the semiconductor layer 22.

Subsequently, the resist pattern 24 was removed. The LPE-GaN layer 23 then was grown on the semiconductor layer 22 as follows. That is, in a nitrogen atmosphere (preferably a pressurized atmosphere of 100 atm ($100 \times 1.013 \times 10^5$ Pa) or lower), the surface of the semiconductor layer 22 with the crystal-nucleus generation regions 22a formed thereon was brought into contact with a melt including gallium, Na, and nitrogen, and the melt was maintained in the supersaturation state.

The crystal-nucleus generation regions may be formed by a method other than the dry etching. An example of other methods for forming the crystal-nucleus generation regions is described below.

Figure 4A:
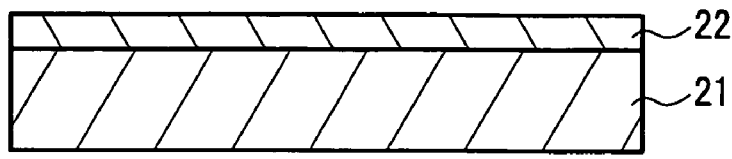
FIGS. 4A to 4D are cross-sectional views showing processes of still another example of the manufacturing method according to the present invention.
Figure 4B:
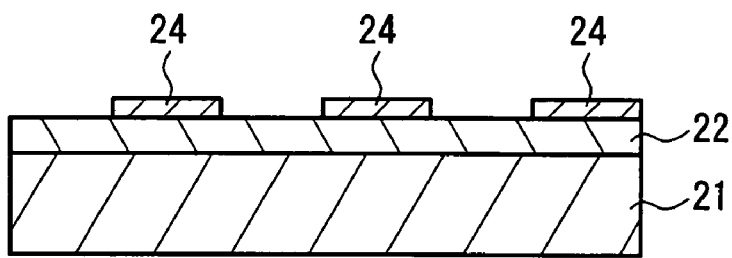
Figure 4C:
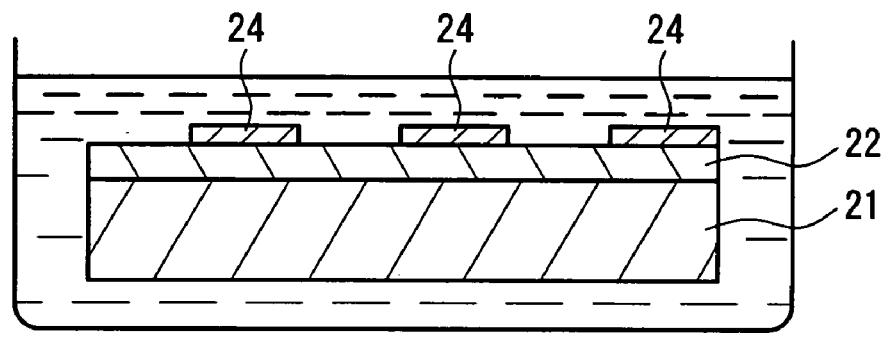
Figure 4D:
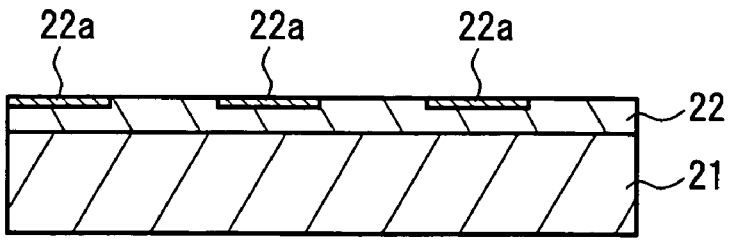

A method of forming crystal-nucleus generation regions by wet etching is shown in FIGS. 4A to 4D. The processes shown in FIGS. 4A and 4B are identical to those shown in FIGS. 2A and 2B. Hence, the same descriptions thereof are not repeated. Next, as shown in FIG. 4C, a sapphire substrate 21 with a resist pattern 24 formed on a semiconductor layer 22 is immersed in a hot phosphoric acid solution having a temperature of 200° C. for 30 minutes and thereby the surface of the semiconductor layer 22 is treated. The semiconductor layer that can be formed by, for example, the MOCVD method has dislocations and defects. Accordingly, with the treatment described above, a number of pits are formed in portions where the resist pattern 24 has not been formed and the portions serve as the crystal-nucleus generation regions 22a. Thereafter, the resist pattern 24 is removed and then the LPE-GaN layer 23 is made to grow.

Figure 3:
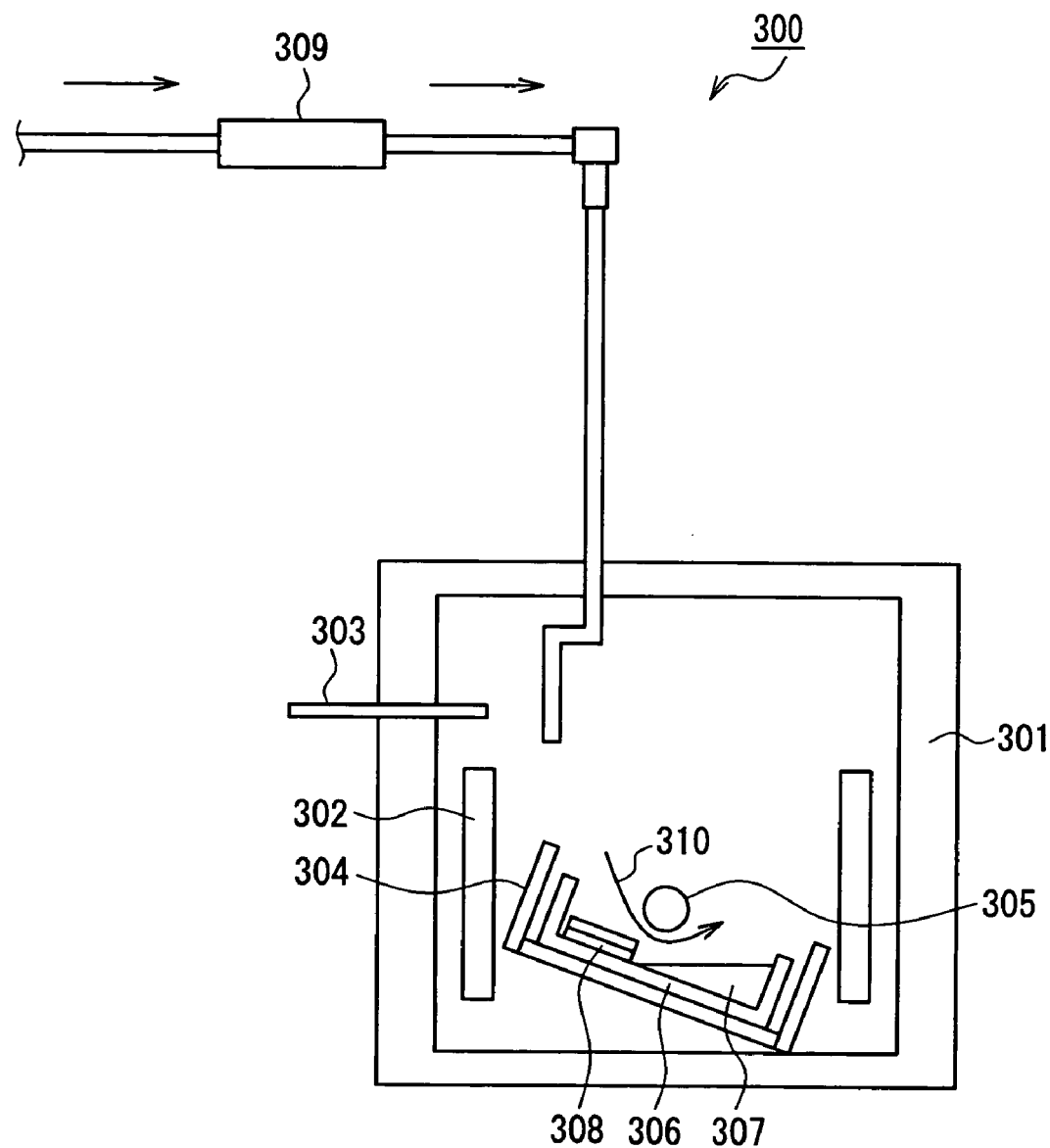
FIG. 3 is a schematic view showing the configuration of an example of the manufacturing apparatus to be used in the manufacturing method of the present invention.

FIG. 3 shows an example of a rocking-type LPE apparatus that is used in the method of the present invention. This rocking-type LPE apparatus 300 includes a growth furnace 301 made of stainless steel and can resist a pressure of 50 atm ($50 \times 1.013 \times 10^5$ Pa). The growth furnace 301 includes a heater 302 and a thermocouple 303 disposed therein. A crucible holding member 304 is disposed inside the growth furnace 301. A mechanism that rotates about a rotary shaft 305 in the direction indicated with the arrow 310 is attached to the crucible holding member 304. A crucible 306 made of boron nitride (BN) or alumina ($Al_2O_3$) is attached to the inner side of the crucible holding member 304. A melt 307 and seed crystals 308 are placed inside the crucible 306. With the rocking of the crucible holding member, the melt present inside the crucible moves from side to side and thereby the melt can be stirred. The ambient pressure is regulated by a flow regulator 309. Nitrogen gas or a mixed gas of ammonia gas ($NH_3$ gas) and nitrogen gas, which is a raw material gas, is supplied from a raw material gas tank and is sent into the growth furnace after impurities are removed therefrom in a gas purifying unit. The growth of GaN crystals using this apparatus can be carried out, for example, as follows.

(1) First, predetermined amounts of Ga and Na to serve as a flux are weighed and then are placed inside the crucible. The Ga used herein was one with a purity of at least 99.9999% (six nines). The Na used herein was purified Na. The Na was purified as follows: Na was heated to melt in a glove box, the inside of which had been subjected to He (or $N_2$ or Ar) substitution, and then for example, oxides emerging on the surface layer were removed. Besides this method, zone refining may be used for purifying Na. In the zone refining, Na is melted and solidified repeatedly in a tube and thereby impurities deposit and then are removed. Thus, the purity of Na can be increased.

(2) In order to melt the raw material placed inside the crucible, the temperature inside the electric furnace was raised to 800° C. In this stage, the seed crystal substrate is not in the melt as shown in the drawing. In order to mix Ga and Na, the crucible was rocked to a degree that allows the melt to be prevented from adhering to the seed crystal substrate. In order to prevent GaN from being oxidized, nitrogen gas was used as the ambient gas.

(3) Next, the crucible was rotated about the rotary shaft and the seed crystal substrate was put into the melt to allow crystals to start growing.

(4) In order to stir the melt, the crucible was rocked during the crystal growth at a speed that allowed it to complete one cycle of rocking per minute. During the growth, the seed crystal substrate was allowed to be in the melt. While the crucible was maintained at 800° C. and the pressure was kept at 40 atm ($40 \times 1.013 \times 10^5$ Pa), LPE growth was carried out for 10 hours to 48 hours.

(5) After the growing process was completed, the crucible was rotated as shown in the drawing, the substrate was taken out of the melt, and then the temperature of the melt was lowered.

When GaN crystals were made to grow by the above-mentioned method, crystals had started growing from the crystal-nucleus generation regions and grew in the lateral direction. Thus excellent GaN single crystals were grown.

In the present example, a flux containing Na alone was used. However, similar effects can be obtained even when using a Li, Na, K, Ca, Sr or Ba flux, and a mixed flux containing alkali metal and alkaline-earth metal. For instance, when using a mixed flux containing Na and Ca, the Ca mixed so as to account for about 10% of the whole allows crystals to grow under lower pressure.

Example 2

Example 2 is an example in which Group III nitride crystals were produced by the method described as the first example of Embodiment 1.

Figure 5A:
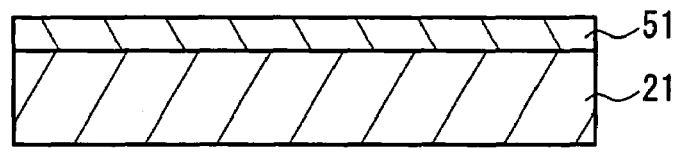
FIGS. 5A to 5C are cross-sectional views showing processes of yet another example of the manufacturing method according to the present invention.
Figure 5B:
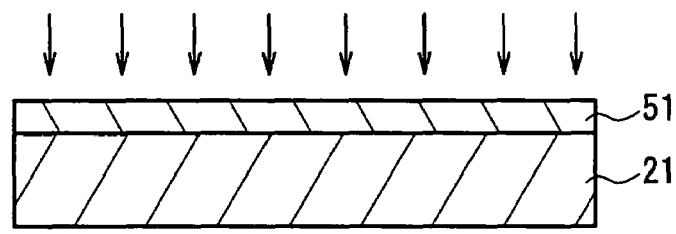
Figure 5C:
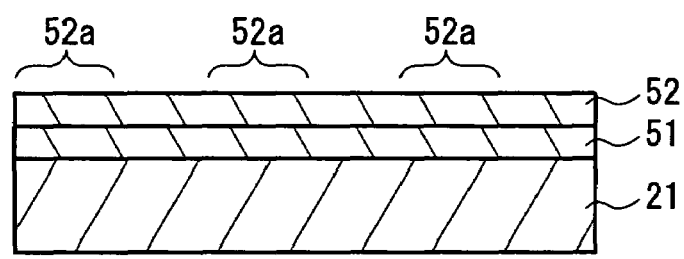

First, as shown in FIG. 5A, a GaN undercoating layer 51 was formed on a sapphire substrate 21. The sapphire substrate 21 was heated so as to have a temperature of about 1020° C. to 1100° C. and then trimethylgallium (TMG) and $NH_3$ were supplied onto the substrate to form the undercoating layer 51. Subsequently, the sapphire substrate 21 with the undercoating layer 51 formed thereon was taken out of the growth unit to be exposed to the air. Thereafter, the substrate was set in the unit again. The sapphire substrate 21 was heated so as to have a temperature of about 1020° C. to 1100° C. and then trimethylgallium (TMG) and $NH_3$ were supplied onto the substrate to form a semiconductor layer 52 containing GaN. In this stage, since the surface of the undercoating layer 51 had been exposed to the air, pits and hillocks were formed at the surface of the semiconductor layer 52 made of crystals grown from the undercoating layer 51. The portions where the pits and hillocks were formed serve as crystal-nucleus generation regions 52a.

A semiconductor layer 52 was produced by the above-mentioned method and then crystal growth was carried out by the LPE method using the semiconductor layer 52. The crystals thus obtained were evaluated. The crystals had started growing from the crystal-nucleus generation regions and grew in the lateral direction. Thus excellent single crystals were grown.

Example 3

Example 3 is an example in which Group III nitride crystals were produced using the method of forming crystal-nucleus generation regions by machining.

Figure 6A:
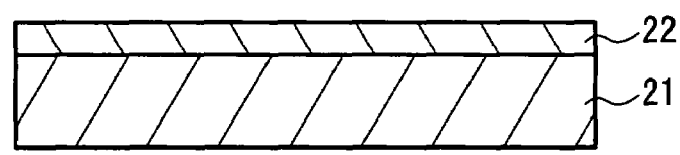
FIGS. 6A and 6B are cross-sectional views showing processes of a further example of the manufacturing method according to the present invention.
Figure 6B:
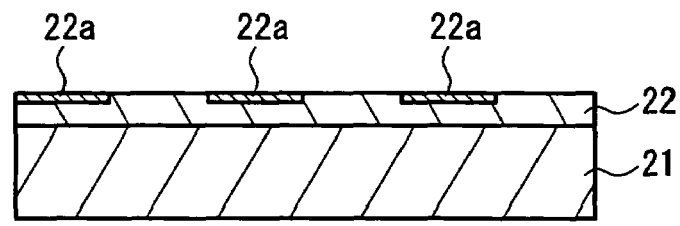

First, as shown in FIG. 6A, a semiconductor layer 22 was formed on a sapphire substrate 21. The process shown in FIG. 6A is identical to that shown in FIG. 2A. Next, grooves with a depth of 10 μm were formed at the surface of the semiconductor layer 22 using a scriber. The grooves were formed in a grid pattern at a pitch of 500 μm. As shown in FIG. 6B, the groove portions (scribed scratches) served as crystal-nucleus generation regions 22a. In this case, diamond was used for the needle of the scriber. The grooves also may be formed using a dicing device.

Figure 7A:
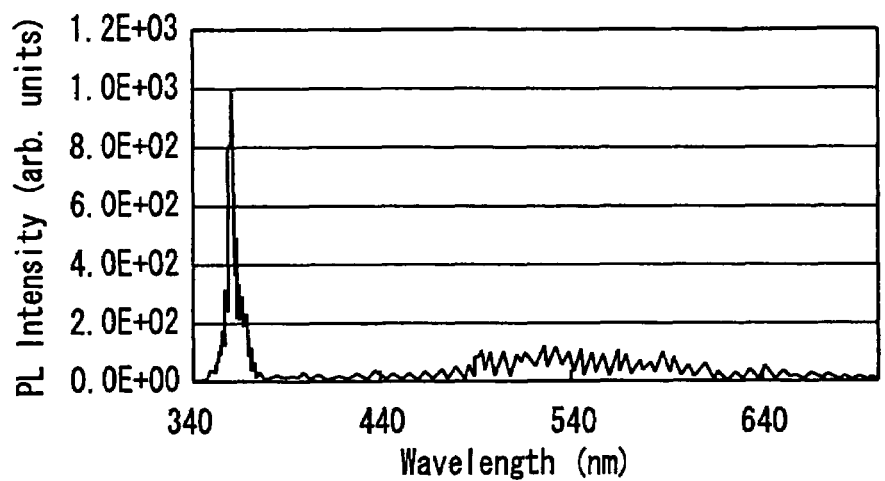
FIG. 7A shows a spectrum of photoluminescence emitted from a GaN semiconductor layer formed by the MOCVD method in Example 3 of the present invention.
Figure 7B:
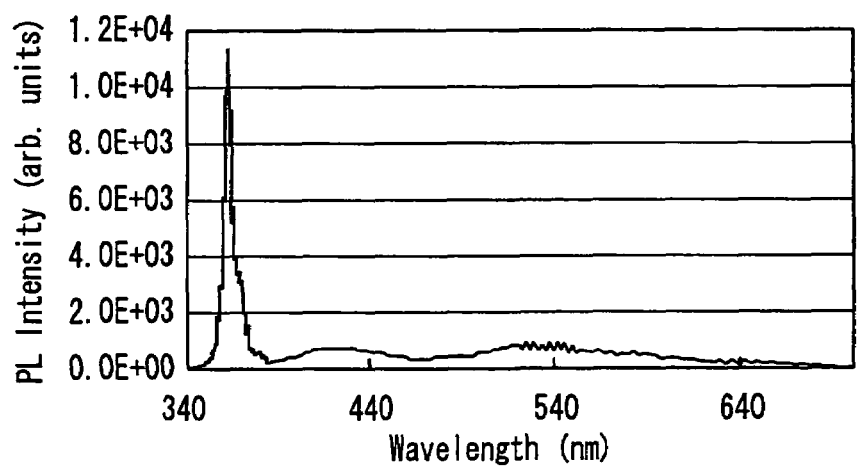
FIG. 7B shows a spectrum of photoluminescence emitted from a GaN semiconductor layer grown at a higher rate by the hydride vapor phase epitaxy (HVPE) method in Example 3 of the present invention.

The GaN semiconductor layer was formed at a higher rate and thereby crystal-nucleus generation regions were formed. The HVPE method is more suitable as the method of growing the semiconductor layer at a higher rate than the MOCVD method. FIG. 7A shows the spectrum of photoluminescence (PL) emitted from the GaN semiconductor layer formed by the MOCVD method while FIG. 7B shows that of PL emitted from the GaN semiconductor layer grown at a higher rate by the HVPE method. The PL was determined by exciting the semiconductor layers with a 0.5 mW, 325 nm He—Cd laser and measuring the PL intensity with a spectroscope. The intensity of PL in the blue band around 420 nm was high in the GaN layer produced by the HVPE method. Conceivably, this is because of nitrogen defects. A substrate having many nitrogen defects included a number of crystal-nucleus generation regions. This allowed crystal growth to be carried out by the LPE method easily. With this method, the LPE crystal growth was carried out and crystals obtained thereby were evaluated. The crystals had started growing from the crystal-nucleus generation regions and then grew in the lateral direction. Thus excellent single crystals were grown.

Example 4

This example is an example in which Group III nitride crystals were formed on a semiconductor layer including crystal-nucleus generation regions having an X-ray diffraction twist angle of 680 seconds or smaller.

Examples 4-1 to 4-6

Semiconductor layers used in the examples included crystal-nucleus generation regions having twist angles of 60 seconds (Example 4-1), 120 seconds (Example 4-2), 312 seconds (Example 4-3), 355 seconds (Example 4-4), 412 seconds (Example 4-5), and 680 seconds (Example 4-6), respectively. Using nitrogen gas as a reactant gas, gallium nitride crystals were grown on the respective semiconductor layers at 850° C. and 35 atm ($35 \times 1.013 \times 10^5$ Pa) to 40 atm ($40 \times 1.013 \times 10^5$ Pa) for 96 hours to 200 hours.

Comparative Examples 1 and 2

As Comparative Examples 1 and 2, gallium nitride crystals were grown in the same manner as in Example 4-1 using semiconductor layers including crystal-nucleus generation regions having twist angles of 752 seconds (Comparative Example 1) and 882 seconds (Comparative Example 2), respectively.

The semiconductor layers used in Examples 4-1 and 4-2 were thick layers of crystals produced by the HVPE or LPE method. In the semiconductor layers, the tilt angle (the half-value width of a rocking curve of X-ray (0002) diffraction) was about 50 seconds to 150 seconds. In the semiconductor layers used in Examples 4-3 to 4-6 and Comparative Examples 1 and 2, the tilt angle was about 150 seconds to 300 seconds. The carrier concentration was $1 \times 10^{16}$ $cm^{-3}$ to $5 \times 10^{16}$ $cm^{-3}$.

With respect to gallium nitride crystals grown in Examples 4-1 to 4-6 and Comparative Examples 1 and 2, the mean thickness and quality thereof were indicated in Table 1 below together with the twist angle of the crystal-nucleus generation regions used therein. In Table 1, "Thick Film" denotes that gallium nitride crystals obtained in the examples have a thickness of 100 μm to 1500 μm while "Thin Film" denotes that they have a thickness of 5 μm to 99 μm. In addition, "Colored" denotes that the crystals were black or blackish brown.

TABLE 1

| | Twist Angle (seconds) | Color of Crystals | Thickness | Remarks |
|---|---|---|---|---|
| Example 4-1 | 60 | Transparent | Thick Film | |
| Example 4-2 | 120 | Transparent | Thick Film | |
| Example 4-3 | 312 | Transparent | Thick Film | |
| Example 4-4 | 355 | Transparent | Thick Film | |
| Example 4-5 | 412 | Transparent | Thick Film | |
| Example 4-6 | 680 | Almost Transparent | Thick Film | |
| Comparative Example 1 | 752 | Colored | Thin Film | Decrease in Reproductivity |
| Comparative Example 2 | 880 | Colored | Thin Film | Decrease in Reproductivity |

As shown in Table 1, a thick film of transparent gallium nitride crystals was obtained in each of Examples 4-1 to 4-6 in which the twist angle of the crystal-nucleus generation regions was 680 seconds or smaller. In Comparative Examples 1 and 2, although crystals were grown under the same conditions, it was often observed that the crystals obtained therein were colored in a range of blackish brown to black and formed a thin film since the twist angle of the crystal-nucleus generation regions exceeded 680 seconds. From these results, it was found that when the twist angle of the nucleus generation layer was 680 seconds or smaller, a thick film of gallium nitride crystals of higher quality was obtained.

Example 5

This example is an example in which Group III nitride crystals were formed on a semiconductor layer including crystal-nucleus generation regions having a carrier concentration of $1 \times 10^{17}$ cm$^{-3}$ or lower.

Examples 5-1 to 5-5

Semiconductor layers used in the examples included crystal-nucleus generation regions having carrier concentrations of $1 \times 10^{16}$ cm$^{-3}$ (Example 5-1), $3 \times 10^{16}$ cm$^{-3}$ (Example 5-2), $5 \times 10^{16}$ cm$^{-3}$ (Example 5-3), $8 \times 10^{16}$ cm$^{-3}$ (Example 5-4), and $1 \times 10^{17}$ cm$^{-3}$ (Example 5-5), respectively. Using nitrogen gas as a reactant gas, gallium nitride crystals were grown on the respective semiconductor layers at 850° C. and 35 atm ($35 \times 1.013 \times 10^5$ Pa) to 40 atm ($40 \times 1.013 \times 10^5$ Pa) for 96 hours to 200 hours. In the present examples, the control of the carrier concentration was carried out through the control of, for instance, the growth rate and growth temperature as well as the use of quartz reaction tubes whose conditions are different from each other. For the quartz reaction tubes whose conditions are different from each other, one that had been installed newly, one that had been used up satisfactorily, etc. were used.

Comparative Examples 3 and 4

Gallium nitride crystals were grown as Comparative Examples 3 and 4 in the same manner as in Example 5-1 using semiconductor layers including crystal-nucleus generation regions having carrier concentrations of $3 \times 10^{17}$ cm$^{-3}$ (Comparative Example 3) and $5 \times 10^{17}$ cm$^{-3}$ (Comparative Example 4), respectively. The crystal-nucleus generation regions used in Examples 5-1 to 5-5 and Comparative Examples 3 and 4 had twist angles of around 500 seconds and tilt angles of 200 seconds to 300 seconds, respectively.

With respect to gallium nitride crystals of Examples 5-1 to 5-5 and Comparative Examples 3 and 4, the mean thickness and quality thereof were indicated in Table 2 below together with the carrier concentrations of the crystal-nucleus generation regions used therein. In Table 2, "Thick Film" denotes that gallium nitride crystals obtained in the examples have a thickness of 100 μm to 1500 μm while "Thin Film" denotes that they have a thickness of 5 μm to 99 μm. In addition, "Colored" denotes that the crystals were black or blackish brown.

TABLE 2

| | Carrier Concentration (cm$^{-3}$) | Color of Crystals | Thickness | Remarks |
|---|---|---|---|---|
| Example 5-1 | $1 \times 10^{16}$ | Transparent | Thick Film | |
| Example 5-2 | $3 \times 10^{16}$ | Transparent | Thick Film | |
| Example 5-3 | $5 \times 10^{16}$ | Transparent | Thick Film | |
| Example 5-4 | $8 \times 10^{16}$ | Transparent | Thick Film | |
| Example 5-5 | $1 \times 10^{17}$ | Almost Transparent | Thick Film | |
| Comparative Example 3 | $3 \times 10^{17}$ | Colored | Thick Film | Decrease in Reproductivity |
| Comparative Example 4 | $5 \times 10^{17}$ | Colored | Thin Film | Decrease in Reproductivity |

As shown in Table 2, a thick film of transparent gallium nitride crystals was obtained in each of Examples 5-1 to 5-5 in which the carrier concentration of the crystal-nucleus generation regions was $1 \times 10^{17}$ cm$^{-3}$ or lower. In Comparative Examples 3 and 4, although crystals were grown under the same conditions, it was often observed that the crystals obtained therein were colored in a range of blackish brown to black and formed a thin film since the carrier concentration of the crystal-nucleus generation regions exceeded $1 \times 10^{17}$ cm$^{-3}$. From these results, it was found that when the carrier concentration of the nucleus generation layer was $1 \times 10^{17}$ cm$^{-3}$ or lower, a thick film of gallium nitride crystals of higher quality was obtained.

When a layer of crystals colored as in the comparative examples is used for the substrate of a light emitting device, for example, the layer of crystals serves as a light absorbing layer to absorb light and thereby causes heat generation or deterioration in output characteristics. Furthermore, the decrease in thickness of the film of crystals that can be grown reduces the productivity of crystals.

Conceivably, the difference in thickness of the film of crystals to be grown with different carrier concentrations occurs because of the following reason. That is, it is conceivable that a semiconductor layer with a high carrier concentration has a high impurity density at its surface. Hence, pinning is caused to prevent crystals from growing in the direction perpendicular to the C axis (growing in the lateral direction). Thus, the lateral growth is inhibited. Conceivably, even when crystals are grown under the same conditions, crystals take in a large amount of impurities and thereby the crystals are colored and grow at a reduced rate.

As described above, the present invention can provide a method of manufacturing Group III nitride crystals that are of high quality, can be manufactured efficiently, are useful as a substrate for semiconductor manufacturing processes, and can be used as a semiconductor substrate. This allows a semiconductor substrate and a semiconductor device produced using the same to be provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method of manufacturing Group III nitride crystals, comprising:
   (i) forming a semiconductor layer that includes crystal-nucleus generation regions at its surface and is made of a semiconductor, the semiconductor being expressed by a composition formula of $Al_uGa_vIn_{1-u-v}N$ (where $0 \leq u \leq 1$, $0 \leq v \leq 1$, and $u+v \leq 1$); and
   (ii) growing Group III nitride crystals on the semiconductor layer by bringing the crystal-nucleus generation regions of the semiconductor layer into contact with a melt in an atmosphere including nitrogen, the melt containing nitrogen, at least one Group III element selected from the group consisting of gallium, aluminum, and indium, and at least one of alkali metal and alkaline-earth metal;
   wherein the crystal-nucleus generation regions have a twist angle of 680 seconds or smaller.

2. The method of manufacturing Group III nitride crystals according to claim 1, wherein the Group III element is gallium, and the Group III nitride crystals are gallium nitride.

3. The method of manufacturing Group III nitride crystals according to claim 1, wherein the atmosphere is a pressurized atmosphere.

4. The method of manufacturing Group III nitride crystals according to claim 1, wherein the semiconductor layer is formed on a substrate.

5. The method of manufacturing Group III nitride crystals according to claim 4, wherein the substrate is one selected from the group consisting of a GaAs substrate whose surface is a (111) plane, a Si substrate whose surface is a (111) plane, a sapphire substrate whose surface is a (0001) plane, and a SiC substrate whose surface is a (0001) plane.

6. A method of manufacturing Group III nitride crystals, comprising:
   (i) forming a semiconductor layer that includes crystal-nucleus generation regions at its surface and is made of a semiconductor, the semiconductor being expressed by a composition formula of $Al_uGa_vIn_{1-u-v}N$ (where $0 \leq u \leq 1$, $0 \leq v \leq 1$, and $u+v \leq 1$); and
   (ii) growing Group III nitride crystals on the semiconductor layer by bringing the crystal-nucleus generation regions of the semiconductor layer into contact with a melt in an atmosphere including nitrogen, the melt containing nitrogen, at least one Group III element selected from the group consisting of gallium, aluminum, and indium, and at least one of alkali metal and alkaline-earth metal;
   wherein the crystal-nucleus generation regions have a carrier concentration of $1 \times 10^{17}$ cm$^{-3}$ or lower.

7. The method of manufacturing Group III nitride crystals according to claim 6, wherein the Group III element is gallium, and the Group III nitride crystals are gallium nitride.

8. The method of manufacturing Group III nitride crystals according to claim 6, wherein the atmosphere is a pressurized atmosphere.

9. The method of manufacturing Group III nitride crystals according to claim 6, wherein the semiconductor layer is formed on a substrate.

10. The method of manufacturing Group III nitride crystals according to claim 9, wherein the substrate is one selected from the group consisting of a GaAs substrate whose surface is a (111) plane, a Si substrate whose surface is a (111) plane, a sapphire substrate whose surface is a (0001) plane, and a SiC substrate whose surface is a (0001) plane.

11. A method of manufacturing Group III nitride crystals, comprising:
    (i-1) forming an undercoating layer made of a semiconductor that is expressed by a composition formula of $Al_sGa_tIn_{1-s-t}N$ (where $0 \leq s \leq 1$, $0 \leq t \leq 1$, and $s+t \leq 1$);
    (i-2) exposing a surface of the undercoating layer to the air;
    (i-3) forming a semiconductor layer on the undercoating layer by growing a semiconductor that is expressed by a composition formula of $Al_uGa_vIn_{1-u-v}N$ (where $0 \leq u \leq 1$, $0 \leq v \leq 1$, and $u+v \leq 1$) and includes crystal-nucleus generation regions at its surface; and
    (ii) growing Group III nitride crystals on the semiconductor layer by bringing the crystal-nucleus generation regions of the semiconductor layer into contact with a melt in an atmosphere including nitrogen, the melt containing nitrogen, at least one Group III element selected from the group consisting of gallium, aluminum, and indium, and at least one of alkali metal and alkaline-earth metal;
    wherein the crystal-nucleus generation regions are at least one of pits and hillocks.

12. The method of manufacturing Group III nitride crystals according to claim 11, wherein the Group III element is gallium, and the Group III nitride crystals are gallium nitride.

13. The method of manufacturing Group III nitride crystals according to claim 11, wherein the atmosphere is a pressurized atmosphere.

14. The method of manufacturing Group III nitride crystals according to claim 11, wherein the semiconductor layer is formed on a substrate.

15. The method of manufacturing Group III nitride crystals according to claim 14, wherein the substrate is one selected from the group consisting of a GaAs substrate whose surface is a (111) plane, a Si substrate whose surface is a (111) plane, a sapphire substrate whose surface is a (0001) plane, and a SiC substrate whose surface is a (0001) plane.

16. A method of manufacturing Group III nitride crystals, comprising:
    (i-a) forming a semiconductor layer made of a semiconductor that is expressed by a composition formula of $Al_uGa_vIn_{1-u-v}N$ (where $0 \leq u \leq 1$, $0 \leq v \leq 1$, and $u+v \leq 1$);
    (i-b) forming crystal-nucleus generation regions by processing a surface of the semiconductor layer by at least one of scribing and dicing to form grooves on the surface of the semiconductor layer; and
    (ii) growing Group III nitride crystals on the semiconductor layer by bringing the crystal-nucleus generation regions of the semiconductor layer into contact with a melt in an atmosphere including nitrogen, the melt containing nitrogen, at least one Group III element selected from the group consisting of gallium, aluminum, and indium, and at least one of alkali metal and alkaline-earth metal.

17. A method of manufacturing Group III nitride crystals, comprising:
(i-a) forming a semiconductor layer made of a semiconductor that is expressed by a composition formula of $Al_uGa_vIn_{1-u-v}N$ (where $0 \leq u \leq 1$, $0 \leq v \leq 1$, and $u+v \leq 1$);
(i-b) forming the crystal-nucleus generation regions by roughening a surface of the semiconductor layer by etching; and
(ii) growing Group III nitride crystals on the semiconductor layer by bringing the crystal-nucleus generation regions of the semiconductor layer into contact with a melt in an atmosphere including nitrogen, the melt containing nitrogen, at least one Group III element selected from the group consisting of gallium, aluminum, and indium, and at least one of alkali metal and alkaline-earth metal.

18. The method of manufacturing Group III nitride crystals according to claim 16, wherein the Group III element is gallium, and the Group III nitride crystals are gallium nitride.

19. The method of manufacturing Group III nitride crystals according to claim 16, wherein the atmosphere is a pressurized atmosphere.

20. The method of manufacturing Group III nitride crystals according to claim 16, wherein the semiconductor layer is formed on a substrate.

21. The method of manufacturing Group III nitride crystals according to claim 20, wherein the substrate is one selected from the group consisting of a GaAs substrate whose surface is a (111) plane, a Si substrate whose surface is a (111) plane, a sapphire substrate whose surface is a (0001) plane, and a SiC substrate whose surface is a (0001) plane.

22. A Group III nitride crystal substrate comprising a semiconductor layer that includes crystal-nucleus generation regions at its surface and Group III nitride crystals formed on the semiconductor layer, wherein a twist angle of the crystal-nucleus generation regions is 680 seconds or smaller, and the Group III nitride crystals is produced by a method of manufacturing Group III nitride crystals according to claim 1.

23. A method of manufacturing a semiconductor substrate comprising Group III nitride crystals, the method comprising growing Group III nitride crystals by a method of manufacturing Group III nitride crystals according to claim 1.

24. A method of manufacturing an electronic device comprising a semiconductor device formed on a substrate, comprising:
growing Group III nitride crystals by a method of manufacturing Group III nitride crystals according to claim 1; and
forming a semiconductor device on the substrate, with the Group III nitride crystals being the substrate.

25. The method of manufacturing an electronic device according to claim 24, wherein the semiconductor device is a laser diode, a light emitting diode, or a field effect transistor.

26. The method of manufacturing an electronic device according to claim 24, wherein the electronic device is a high frequency device or a high power device.

* * * * *